(12) United States Patent  
Kawamoto et al.

(10) Patent No.: US 7,651,924 B2  
(45) Date of Patent: Jan. 26, 2010

(54) METHOD OF FABRICATING SEMICONDUCTOR MEMORY DEVICE IN WHICH AN OXIDE FILM FILLS A TRENCH IN A SEMICONDUCTOR SUBSTRATE

(75) Inventors: Hiroshi Kawamoto, Kanagawa (JP); Naoki Kai, Mie (JP); Koichi Matsuno, Mie (JP); Minori Kajimoto, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/233,052

(22) Filed: Sep. 18, 2008

(65) Prior Publication Data

US 2009/0081846 A1  Mar. 26, 2009

(30) Foreign Application Priority Data

Sep. 20, 2007  (JP)  ............................. 2007-243744

(51) Int. Cl.  
*H01L 21/76*  (2006.01)  
*H01L 21/31*  (2006.01)  
*H01L 21/469*  (2006.01)

(52) U.S. Cl. .................. 438/438; 438/782; 438/789; 438/790; 257/E21.263; 257/E21.279; 257/E21.546

(58) Field of Classification Search ............... 438/438, 438/789; 257/E21.263, E21.279, E21.546  
See application file for complete search history.

(56) References Cited

U.S. PATENT DOCUMENTS

| 5,770,760 | A | * | 6/1998 | Robinson ................. 560/221 |
| 5,976,618 | A | * | 11/1999 | Fukuyama et al. .......... 427/226 |
| 2007/0004170 | A1 | | 1/2007 | Kawasaki et al. |
| 2007/0284649 | A1 | * | 12/2007 | Iwasawa ..................... 257/321 |
| 2008/0064212 | A1 | | 3/2008 | Ogawa et al. |

FOREIGN PATENT DOCUMENTS

| JP | 7-45605 | | 2/1995 |
| JP | 8-306681 | | 11/1996 |
| JP | 408306681 A | * | 11/1996 |
| JP | 2007-27697 | | 2/2007 |
| JP | 2007-266081 | | 10/2007 |

* cited by examiner

Primary Examiner—Walter L Lindsay, Jr.  
Assistant Examiner—Ron Pompey  
(74) Attorney, Agent, or Firm—Oblon, Spivak, McClelland, Maier & Neustadt, L.L.P.

(57) ABSTRACT

A method of fabricating a semiconductor device includes applying a coating oxide film to a surface of a substrate including a semiconductor substrate so that a recess formed in the surface is filled with the coating oxide film, applying a steam oxidation treatment to the substrate at a first temperature, soaking the substrate in heated water while applying a megasonic wave to the substrate in the heated water, and applying a steam oxidation treatment to the substrate at a second temperature higher than the first temperature.

9 Claims, 8 Drawing Sheets

METHOD OF FABRICATING SEMICONDUCTOR MEMORY DEVICE IN WHICH AN OXIDE FILM FILLS A TRENCH IN A SEMICONDUCTOR SUBSTRATE

CROSS-REFERENCE TO RELATED APPLICATIONS

This application is based on and claims the benefit of priority from the prior Japanese Patent Application No. 2007-243744, filed on Sep. 20, 2007, the entire contents of which are incorporated herein by reference.

BACKGROUND OF THE INVENTION

1. Field of the Invention

The present invention relates to a method of fabricating a semiconductor device which processes a substrate including a semiconductor substrate, and more particularly to such a method including a step of forming a coating oxide film in a recess of the substrate.

2. Description of the Related Art

Semiconductor devices such as NAND flush memories necessitate microfabrication. An element isolation region is formed by a shallow trench isolation (STI) process in these semiconductor devices. In the STI process, a silicon oxide film or the like is buried in a trench formed in an upper surface of a semiconductor substrate so that an element isolation region is formed. A high density plasma (HDP) film has conventionally been buried in a trench by a plasma chemical vapor deposition (PCVD) process. However, with progress of microfabrication in design patterns, it has become more and more difficult to sufficiently fill a trench.

In view of the circumstances, the use of a coating oxide film such as spin on glass (SOG) has recently been proposed. The coating oxide film includes a polysilazane (PSZ) film, for example. When a coating oxide film is to be formed on a semiconductor substrate, a coating liquid is applied to the semiconductor substrate. Consequently, the coating liquid can reliably fill an interior of a trench which is located in a region with a high aspect ratio such as a memory cell region and has a small opening width. Furthermore, the coating liquid can also be buried thick in a larger region such as a peripheral circuit region in the trench interior.

Subsequently, a thermal treatment needs to be applied to the coating oxide film applied to the semiconductor substrate in the aforesaid manner so that the coating oxide film is hardened. Furthermore, impurities such as carbon (C), nitrogen (N) and the like need to be removed from the coating oxide film. In the case of the polysilazane film, however, the aforementioned thermal treatment causes film contraction which results in high stress fluctuations. As a result, a crack occurring in the coating oxide film sometimes reaches the semiconductor substrate.

In order that occurrence of cracks may be prevented, for example, Japanese published patent application JP-A-2007-27697 discloses a method in which a combination of a thermal treatment with several treatment steps and an aqueous cleaning with several treatment steps is carried out during a stabilization treatment by thermal treatment. However, the aforesaid combined treatment increases the number of treatment steps, thereby increasing the manufacturing cost. For example, a low-temperature water vapor generation (WVG) oxidation (oxidation by hydrogen combustion) is carried out after the coating of a PSZ film. Thereafter, several steps of a treatment by heated water or a sulfuric acid peroxide mixture (SPM) treatment are sometimes added for the purpose of stabilization of the PSZ film. Furthermore, there is a case in which are required a second step thermal treatment and subsequent several steps of the treatment by heated water or SPM treatment.

BRIEF SUMMARY OF THE INVENTION

The present invention provides a method of fabricating a semiconductor device, comprising applying a coating oxide film to a surface of a substrate including a semiconductor substrate so that a recess formed in the surface is filled with the coating oxide film, applying a steam oxidation treatment to the substrate at a first temperature, soaking the substrate in heated water while applying a megasonic wave to the heated water, and applying another steam oxidation treatment to the substrate at a second temperature higher than the first temperature.

The invention also provides a method of fabricating a semiconductor device, comprising applying a coating oxide film forming a solution to a recess formed in a surface of a substrate including a semiconductor substrate, baking the substrate at a post-coating baking temperature and forming a coating oxide film so that the recess is filled with the coating oxidation, soaking the substrate in heated water while applying a megasonic wave to the heated water, and applying a steam oxidation treatment to the substrate.

BRIEF DESCRIPTION OF THE DRAWINGS

Other features and advantages of the present invention will become clear upon reviewing the following description of one embodiment with reference to the accompanying drawings, in which.

DETAILED DESCRIPTION OF THE EMBODIMENT

A first embodiment of the present invention will be described with reference to FIGS. 1 to 6 of the accompanying drawings. The invention is applied to a NAND flash memory in the embodiment. In the following description, identical or similar parts are labeled by the same reference numerals. The drawings typically illustrate the invention, and the relationship between a thickness and plane dimension, layer thickness ratio and the like differ from natural size.

Figure 1:
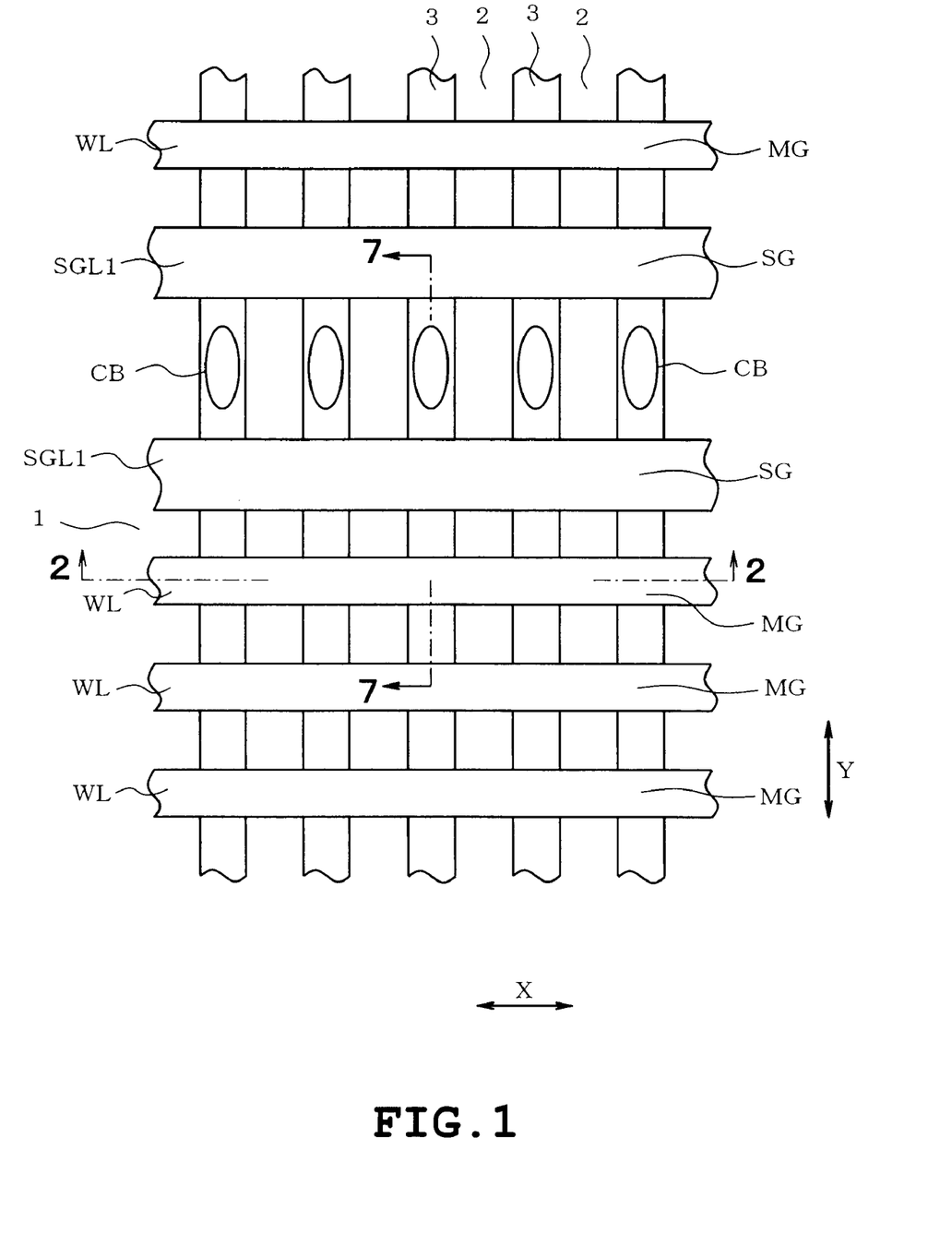
FIG. 1 is a schematic plan view showing a layout pattern of part of a memory cell region of a NAND flash memory device of a first embodiment in accordance with the present invention.

FIG. 1 is a schematic plan view showing a layout pattern of part of a memory cell region of the NAND flash memory device. A silicon substrate 1 serving as a semiconductor substrate has a plurality of element isolation insulating films 2 formed at predetermined intervals in the Y direction in FIG. 1. Each element isolation insulating film 2 is formed so as to have a shallow trench isolation (STI) structure. As the result of the forming of the element isolation insulating films 2, a plurality of active regions 3 are separately formed so as to extend in the X direction in FIG. 1. A plurality of word lines WL of memory cell transistors are formed at predetermined intervals in the X direction perpendicular to the active regions 3 in FIG. 1. Furthermore, a pair of selective gate lines SGL1 of selective gate transistors are formed so as to extend in the X direction in FIG. 1. A plurality of bit line contacts CB are formed in portions of the active regions 3 located between the paired selective gate lines SGL1 respectively. A plurality of gate electrodes MG of the memory cell transistors are formed on portions of the active regions 3 intersecting the word lines WL respectively. The gate electrodes MG serve as first gate electrodes. A pair of gate electrodes SG of the selective gate transistors are formed on portions of the active regions 3 intersecting the selective gate lines SGL1 respectively. The gate electrodes SG serve as second gate electrodes. Each aforesaid memory cell transistor is constituted by the gate electrode MG and source/drain regions formed in the active regions located at both sides of the gate electrode MG. Each selective gate transistor is constituted by the gate electrode SG and the source/drain regions formed in the active regions located at both sides of the gate electrode SG.

Figure 2:
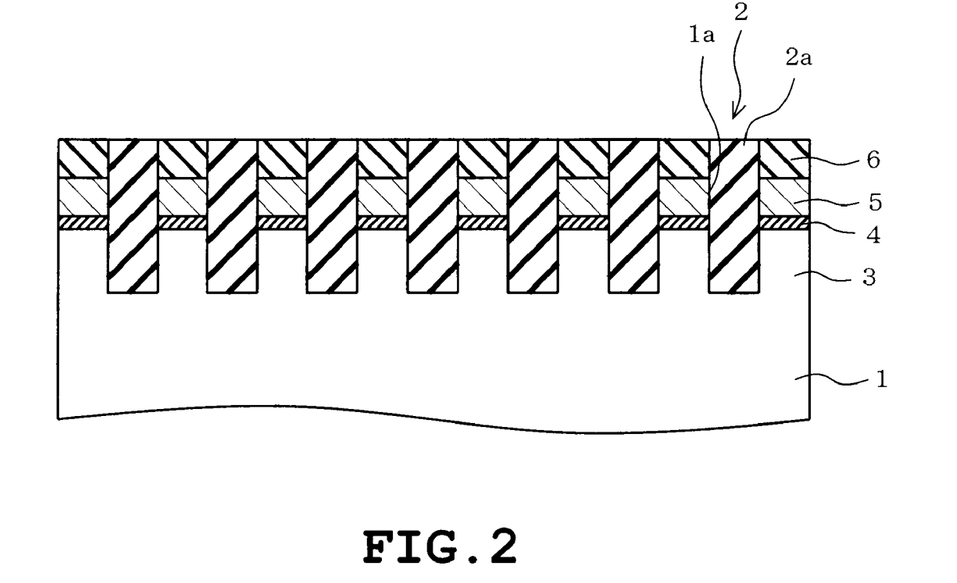
FIG. 2 is a sectional view taken along line 2-2 in FIG. 1.

FIG. 2 is a sectional view taken along line 2-2 in FIG. 1, showing the element isolation insulating films 2 formed by filling trenches formed in the silicon substrate 1 with element isolation insulating films. In FIG. 2, trenches 1a are formed in an upper surface of the silicon substrate 1 at predetermined intervals. A surface layer of the silicon substrate 1 is formed into the separate active regions 3. Each trench 1a serves as recess formed in the substrate including the silicon substrate 1. A silicon oxide film 2a is provided in each element isolation insulating film 2. The silicon oxide film 2a is formed by filling each element isolation insulating film 2 with a coating oxide film serving as a silicon oxide film, such as polysilazane. The polysilazane coating liquid which has a high fluidity can reliably fill each trench 1a even when each trench 1a has a large aspect ratio. On an upper surface of each active region 3 are sequentially deposited a silicon oxide film 4 serving as a gate insulating film, a polycrystalline silicon film 5 serving as a floating gate and a silicon nitride film 6 for processing purpose.

The element isolation insulating films 2 are subsequently etched back so as to be reduced to a predetermined height. Subsequently, the silicon nitride film 6 is removed, an intergate insulating film and a polycrystalline silicon film serving as a control gate are then deposited in turn. Thus, a configuration as shown in FIG. 1 is obtained through an ordinary fabrication process of NAND flash memory.

Figure 3:
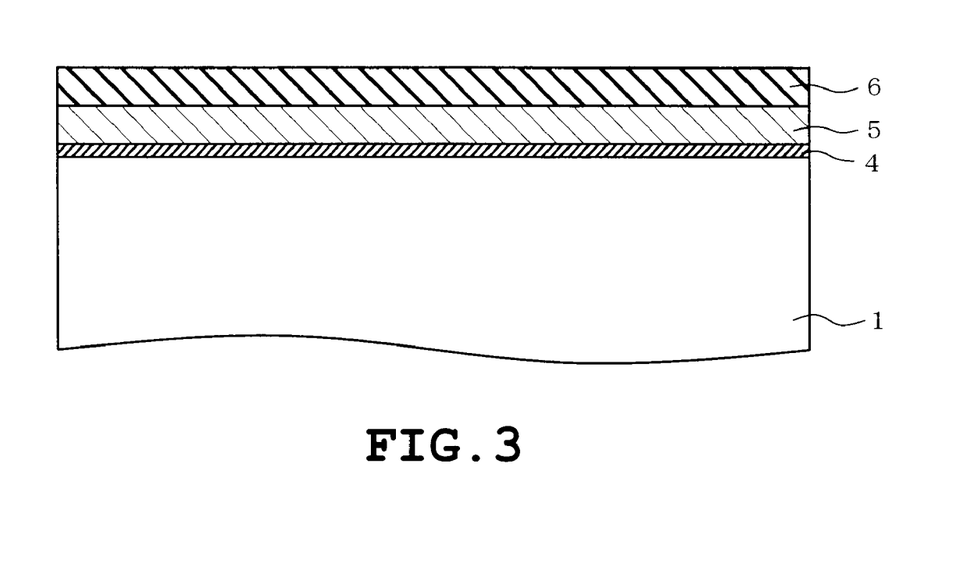
FIGS. 3 to 6 are schematic longitudinal sectional views at sequential stages of the fabricating process of the NAND flash memory device (Nos. 1 to 4)

Referring now to FIGS. 3 to 6, steps will be described in which the trenches 1a are formed in the silicon substrate 1, the polysilazane coating liquid serving as the coating oxide film is applied, and the silicon oxide film 2a is formed in each element isolation insulating film 2. Firstly, as shown in FIG. 3, a silicon oxide film 4 serving as a gate insulating film is formed on the upper surface of the silicon substrate 1 so as to have a predetermined film thickness. Subsequently, the polycrystalline silicon film 5 serving as the floating gate is formed on the silicon oxide film 4 by a low pressure chemical vapor deposition (LPCVD) process. In this case, impurities are added to the polycrystalline silicon film 5, and the polycrystalline silicon film 5 is formed so as to have a predetermined film thickness. Furthermore, the silicon nitride film 6 is formed on an upper surface of the polycrystalline silicon film 5. The silicon nitride film 6 serves both as a hard mask material for etching and as a stopper in a chemical mechanical polishing (CMP) treatment.

Figure 4:
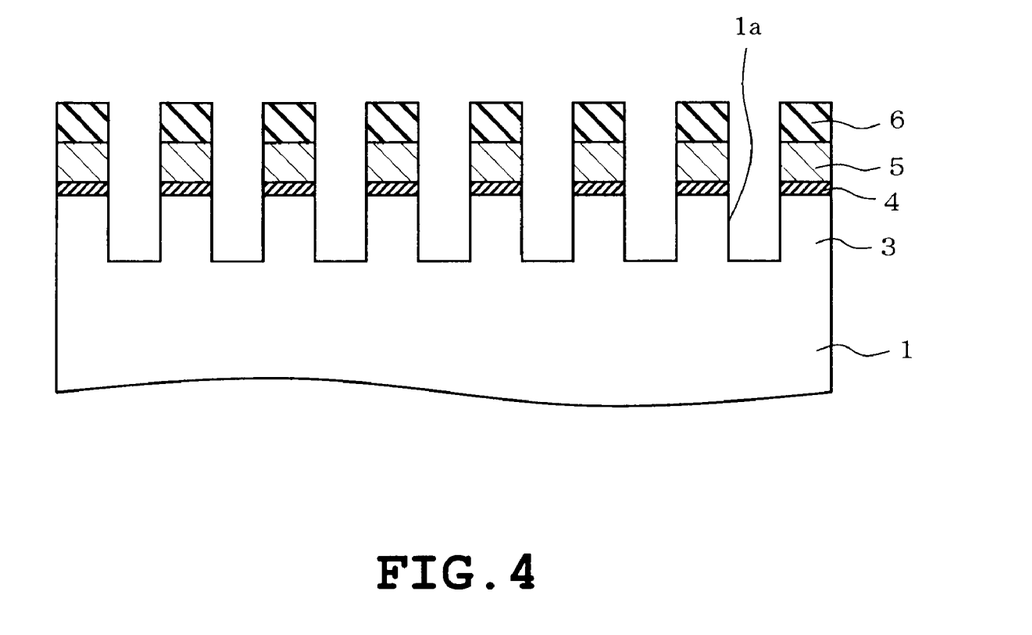

Subsequently, etching is applied to an upper surface of the silicon nitride film 6 so that the trenches 1a are formed, as shown in FIG. 4. Firstly, a resist is applied to the upper surface of the silicon nitride film 6 and patterned by a photolithography process. The silicon nitride film 6 is etched by a reactive ion etching (RIE) process with the patterned resist serving as a mask. Subsequently, the polycrystalline silicon film 5, silicon oxide film 4 and silicon substrate 1 are sequentially etched with the patterned silicon nitride film 6 serving as a mask. Consequently, the memory cell region of the silicon substrate 1 is etched so that a predetermined depth is reached, whereby the trenches 1a are formed.

Figure 5:
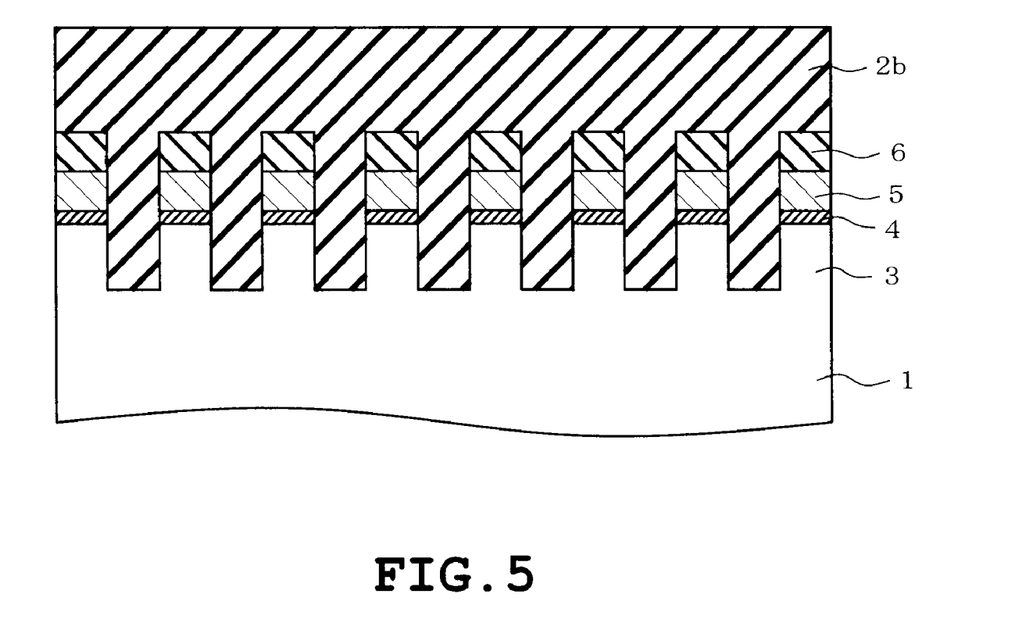

Subsequently, the PSZ film 2b is formed in order that the element isolation insulating films 2 each with the STI structure may be formed, as shown in FIG. 5. Firstly, the PSZ coating liquid is applied to the upper surface of the silicon substrate 1 formed with the trenches 1a by a spin coat method. A predetermined baking treatment is then carried out. For example, a thermal treatment is carried out at 150° C. for about 3 minutes by the use of a hot plate, so that the PSZ film 2b is obtained. The PSZ coating liquid is a solution containing perhydrogenated silazane polymer ($(SiH_2NH)n$) or a solution of perhydrogenated silazane polymer. The PSZ coating liquid is coated by the aforesaid spin coat method with a film thickness of about 600 nm, for example. A baking treatment is applied to the coated solution of perhydrogenated silazane polymer such that a solvent of the perhydrogenated silazane polymer solution is volatilized, whereupon the PSZ film 2b is obtained.

Subsequently, a first water vapor generation (WVG) treatment is carried out at a first temperature ranging from 200° C. to 400° C., for example, at 280° C. or 300° C. The first WVG treatment is carried out as a film quality stabilization thermal treatment for the PSZ film 2b. When the WVG treatment is carried out at or below 400° C., the PSZ film 2b is not transformed to a silicon oxide film ($SiO_2$) 2a, containing silicon-hydrogen (Si—H) bond, nitrogen-hydrogen (N—H) bond, silicon-nitrogen (Si—N) bond remaining therein.

Figure 6:
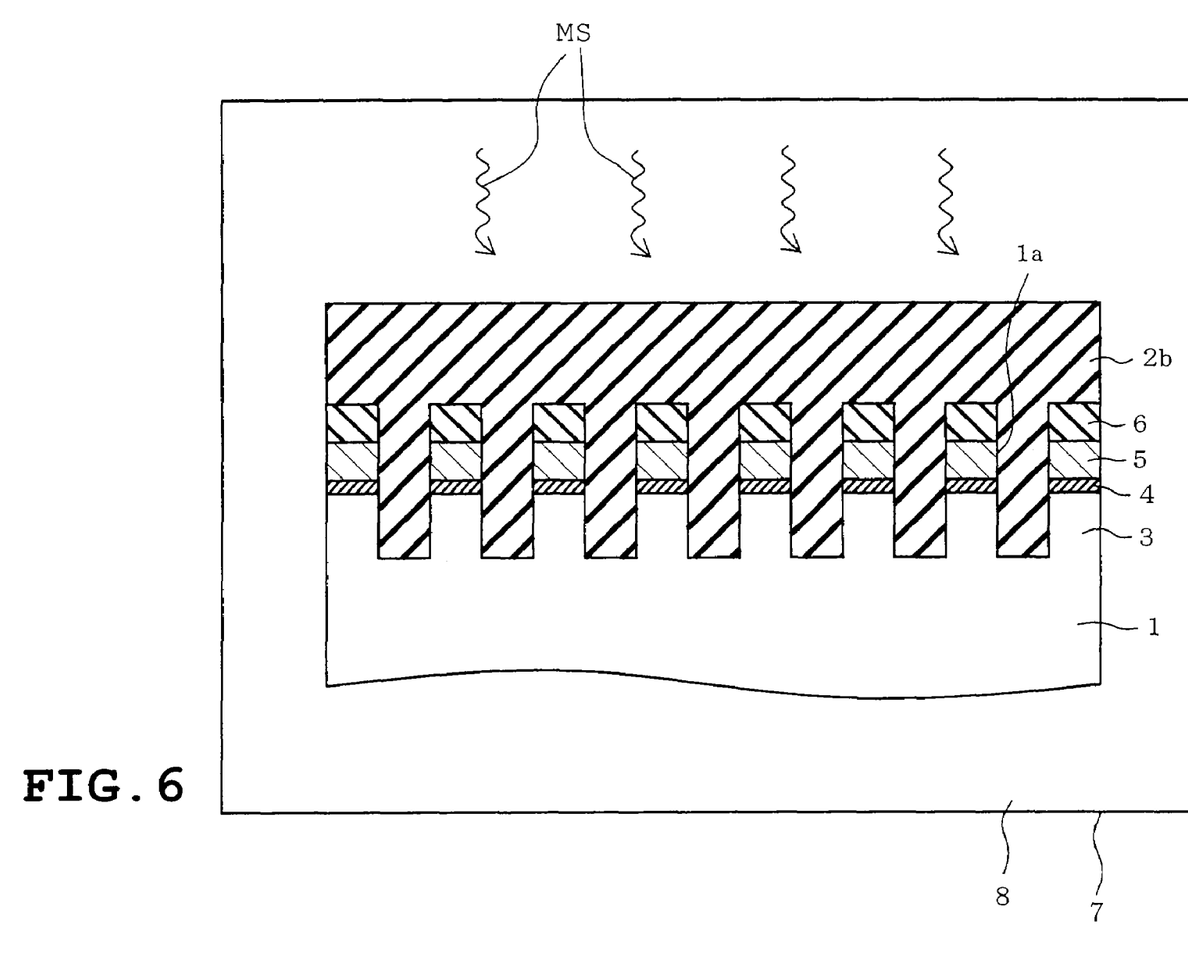

Subsequently, ultrasonic waves or more preferably megasonic waves are applied to the heated water in which the silicon substrate is soaked, as shown in FIG. 6. The PSZ film 2b is still unstable even after execution of the aforesaid first WVG treatment. This megasonic wave application in the heated water is a pretreatment in the case where a water vapor generation at a further higher temperature is to be carried out. When a rapid high-temperature WVG treatment is applied to the PSZ film 2b, film shrinkage suddenly occurs in the PSZ film 2b, resulting in occurrence of cracks in the PSZ film 2b. The PSZ film 2b is steam-oxidated at two stages of low and high temperatures respectively in order to be prevented from the aforesaid occurrence of cracks. However, there still remains a possibility that cracks occur in the PSZ film 2a. In view of the possibility, a further WVG treatment is carried out at a temperature further lower than the aforesaid low temperature so that oxidation of PSZ film is further facilitated before execution of the high-temperature WVG treatment, whereby the film quality of the PSZ film 2b can be improved. The application of megasonic waves is carried out in order that oxidation by the heated water may be facilitated deep into the PSZ film 2b.

The above-described heated water treatment employs a batch cleaning apparatus 7 as shown in FIG. 6 so that the silicon substrate is soaked in heated water 8 whose temperature is at or above 50° C. or preferably at 60° C. A megasonic wave is applied to the heated water 8 in the cleaning apparatus 7 in the heated water treatment. Wave lines MS in FIG. 6 designate application of the megasonic waves. The megasonic wave has a frequency ranging from several hundreds kHz to several MHz, 800 kHz (0.8 MHz), for example. Output of the megasonic wave to be applied is set to 100 W, for example, when the frequency ranges from several tens W to several hundreds W. Furthermore, a treatment time of the water treatment is set at several tens minutes or above, for example, about 30 minutes.

When the heated water treatment is carried out while the megasonic wave is applied to the heated water 8 as described above, effects of the heated water treatment can be increased as compared with the case where a mere heated water treatment is carried out. The reason for this can be presumed that tensile stress produced in the film due to film shrinkage caused during transformation of the PSZ film 2b to the silicon oxide film 2a, whereby the occurrence of cracks can be prevented.

Subsequently, a second WVG treatment is applied to the silicon substrate 1 having been treated by the heated water. The second WVG treatment is carried out at a second temperature higher than the first temperature. The second temperature ranges 400° C. to 600° C. and is set at 550° C., for example. As a result, the PSZ film 2b is further hardened into a silicon oxide film 2a thereby to be stabilized. In this case, the heated water treatment is carried out with application of megasonic waves to the heated water prior to the second WVG treatment. Since the PSZ film is sufficiently oxidized, occurrence of rapid thermal shrinkage thereof can be prevented. Consequently, the PSZ film 2b can be transformed into the desirable silicon oxide film 2a while occurrence of cracks is suppressed.

Subsequently, a chemical mechanical polishing (CMP) process is carried out in order that the PSZ film 2b corresponding to the portions of the gate electrodes MG and SG may be removed with the silicon oxide film 2a in the trenches 1a remaining. The silicon nitride film 6 serves as a stopper in the CMP process. As a result, the structure as shown in FIG. 2 is obtained. Subsequent to the aforesaid CMP process, the heated water treatment may again be carried out with the megasonic wave being applied to the heated water as the need arises. Consequently, the stabilization of the silicon oxide film 2a can further be achieved.

A second embodiment of the invention will be described. In the second embodiment, the WVG treatment carried out in the first embodiment is eliminated, and another WVG treatment is carried out subsequent to the heated water treatment, instead. Accordingly, since the steps related to the thermal treatment in the first embodiment are only changed in the second embodiment, the differences will mainly be described in the following with reference to FIGS. 1 to 6.

The following describes the case where the trenches 1a formed in the silicon substrate 1 in the same manner as in the first embodiment are filled with the PSZ film 2b serving as the element isolation insulating film. In the second embodiment, a post-application baking treatment is carried out at a high temperature after application of the PSZ liquid as shown in FIG. 5. More specifically, a hot plate is used to apply heat in the post-application baking treatment. The temperature in the post-application baking treatment is set so as to be higher (200° C. to 250° C., for example) than the temperature in the post-application baking treatment in the first embodiment. The temperature in the post-application baking treatment is set at such a temperature that the PSZ film 2b is prevented from dissolving in the heated water in the post-process megasonic application.

Subsequently, as shown in FIG. 6, the heated water treatment is carried out while the megasonic wave is applied to the heated water in the same manner as in the first embodiment. In this case, treatment conditions may be the same as the treatment conditions in the first embodiment or may be set so as to fall within the above-described set range. The WVG treatment is carried out after the heated water treatment. In the second embodiment, the WVG treatment can be carried out under the same conditions as in the first WVG treatment in the first embodiment. Furthermore, the WVG treatment can be carried out at a temperature higher than the first temperature in the first embodiment if the need arises.

According to the second embodiment, the WVG treatment is carried out in a single step although the WVG treatment is divided into two steps in the first embodiment. Consequently, the time necessary for the fabrication process can be reduced. Even in this case, the heated water treatment is carried out while the megasonic wave is applied to the water 8. Accordingly, the film quality of the PSZ film 2b can efficiently be stabilized, and the PSZ film 2b can efficiently be formed into the silicon oxide film 2a.

FIGS. 7 to 12 illustrate a third embodiment of the invention. The third embodiment differs from the first embodiment in a part to be processed. More specifically, the third embodiment is directed to the forming of a silicon oxide film using the PSZ film as the insulating film used for insulation between the gate electrodes MG, SG, and MG and SG in the active region 3 in the section of the NAND flash memory taken along line 7-7 in FIG. 1.

Figure 7:
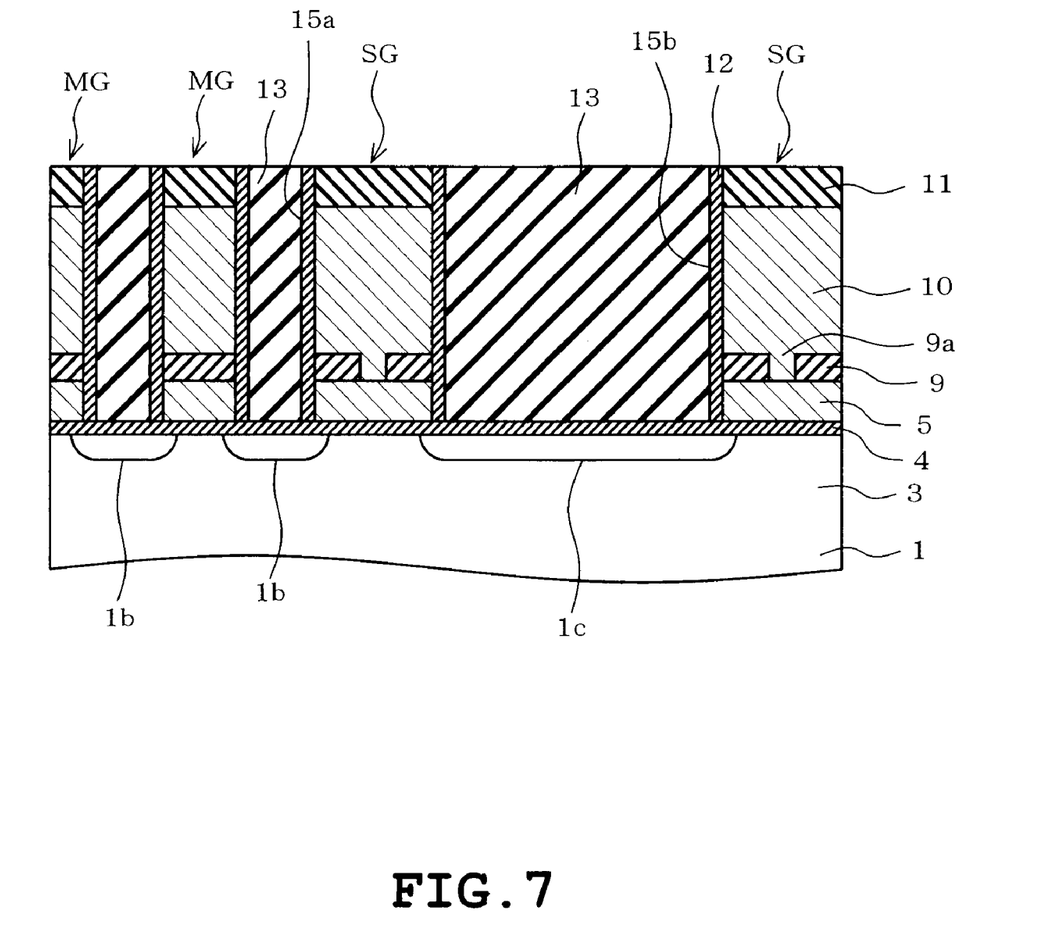
FIG. 7 is a sectional view taken along line 7-7 in FIG. 1, showing a third embodiment of the invention.

Referring to FIG. 7 showing the middle stage of the fabricating process, each of the gate electrodes MG and SG formed on the silicon substrate 1 includes the polycrystalline silicon film 5 formed on a tunnel insulating film 4 serving as the gate insulating film and formed on the silicon substrate 1, the interelectrode insulating film 9 comprised of an ONO film, the polycrystalline silicon film 10 for the control gate electrode, and the silicon nitride film 11 all of which are sequentially deposited. The intergate insulating film 9 of the gate electrode SG is formed with the openings 9a through which the polycrystalline silicon films 5 and 10 conduct electricity. The openings 9a are filled with the polycrystalline silicon film 10. The impurity diffusion regions 1b serving as the source/drain regions are formed between the gate electrodes MG and between the gate electrodes MG and SG of the silicon substrate 1 respectively. Another impurity diffusion region 1c is formed between the gate electrodes SG in the same manner as the impurity diffusion regions 1b.

Silicon oxide films 12 are formed on sidewalls of the gate electrodes MG and SG respectively. Furthermore, spaces 15a are defined between the gate electrodes MG and the gate electrodes MG and SG, and a space 15b is defined between the gate electrodes SG. The spaces 15a and 15b are filled with silicon oxide films 13 formed by the PSZ film 13a with the silicon oxide film 13 being interposed therebetween. The silicon oxide film 13 is formed by the same manner as in the first embodiment. The spaces 15a and 15b between the gate electrodes MG and the gate electrodes MG and SG correspond to a recess of the substrate constituted by the electrodes MG and SG with the silicon substrate 1 being included.

The silicon oxide film 13 is thereafter left in the filling state between the gate electrodes MG and the gate electrodes MG and SG, whereupon the silicon oxide film 13 can be used as an insulating film improving insulating isolation between the gate electrodes. Furthermore, the silicon oxide film 11 is removed in a post-process, and silicide is formed on an upper part of the polycrystalline silicon film 10. Additionally, a contact hole is formed between the gate electrodes SG so as to extend vertically through the silicon oxide film 13. The contact hole is filled with a conductor so that a bit line contact is formed.

Figure 8:
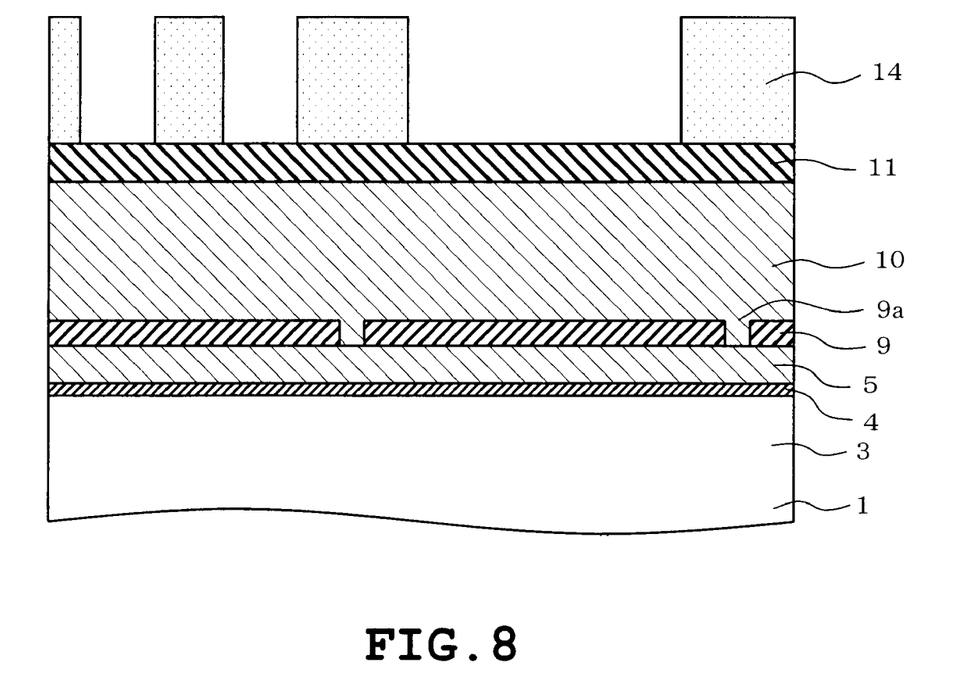
FIGS. 8 to 12 are schematic longitudinal sectional views at sequential stages of the fabricating process of the NAND flash memory device (Nos. 1 to 5).

A step of forming the silicon oxide film 13 using the PSZ film in the above-described configuration will be described together with forming steps therearound. Firstly, as shown in FIG. 8, a photolithography process is carried out to form the gate electrodes MG and SG. The silicon nitride film 6 formed in the first embodiment is removed in the state as shown in FIG. 3 prior to the photolithography process. The polycrystalline silicon film 10 is then deposited and serves as the intergate insulating film 9 and the control gate (word line). Furthermore, the silicon nitride film 11 is deposited on the polycrystalline silicon film 10 and serves as a hard mask in a dry etching process. Subsequently, the photolithography process is carried out so that a resist 14 is coated and predetermined selective gate and word line patterns are formed. After the intergate insulating film 9 has been formed on the polycrystalline silicon film 5, part of the intergate insulating film 9 in the gate electrode SG forming region is removed so that an opening 9a is formed. The polycrystalline silicon film 10 is buried in the opening 9a when formed on the intergate insulating film 9.

Figure 9:
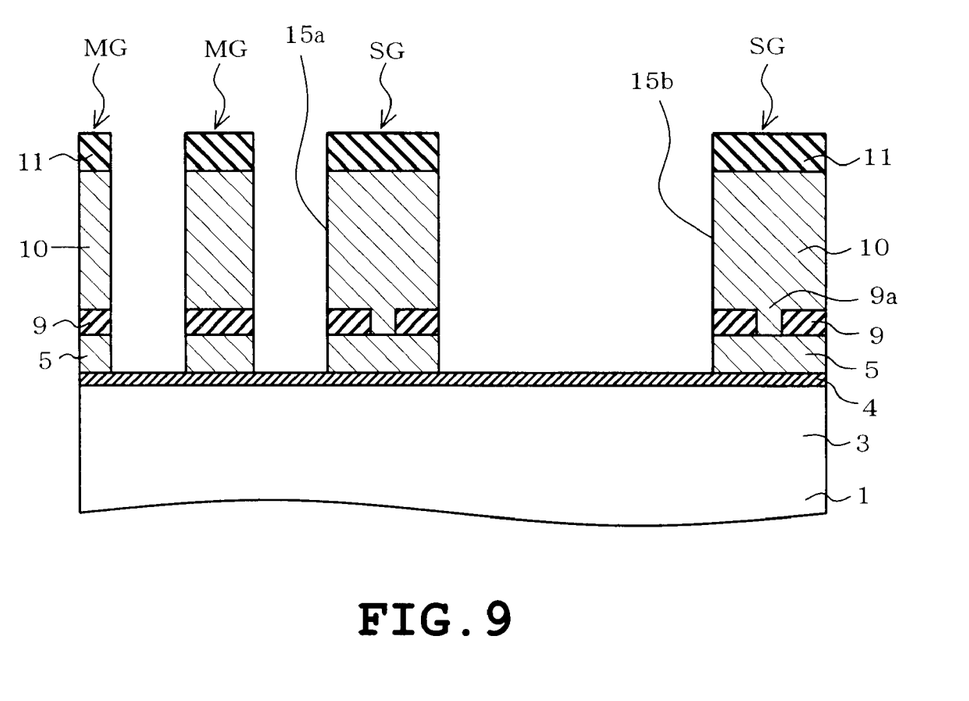
Figure 10:
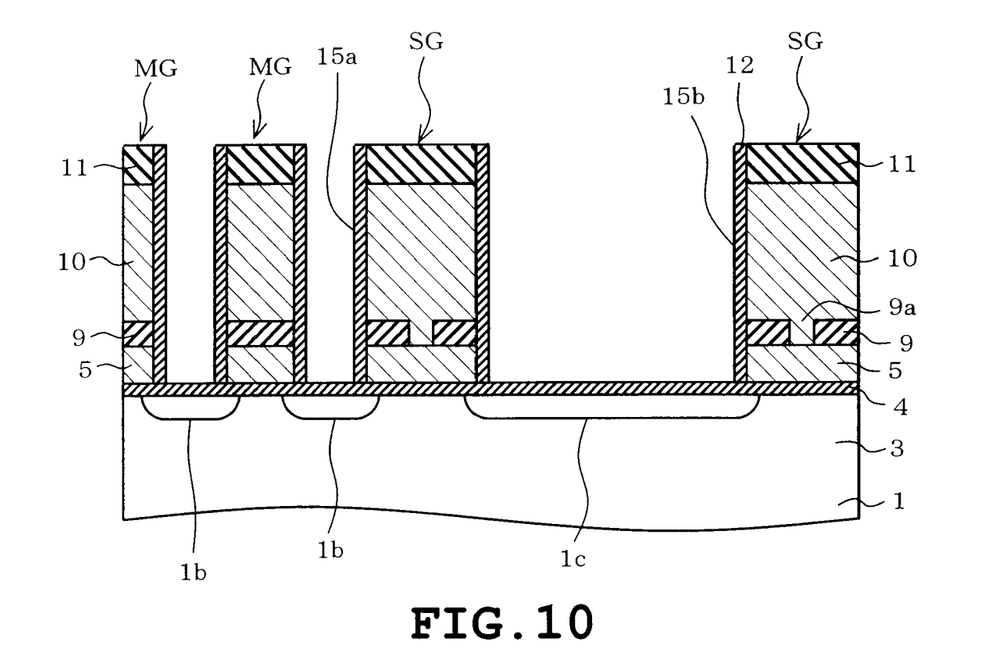

Subsequently, the silicon nitride film 11 is etched by a dry etching technique such as the RIE method with the patterned resist 14 serving as a mask as shown in FIG. 9. The polycrystalline silicon film 10, intergate insulating film 9 and polycrystalline silicon film 5 are then etched with the resist 14 serving as a hard mask. The resist 14 is thereafter removed. Subsequently, an oxidation treatment is carried out by a rapid thermal oxidation (RTO) treatment so that a thermal silicon oxide film is formed, as shown in FIG. 10. A silicon oxide film is also formed by the LPCVD process. As a result, silicon oxide films 12 are formed on the sidewalls of the gate electrodes MG and SG respectively.

Figure 11:
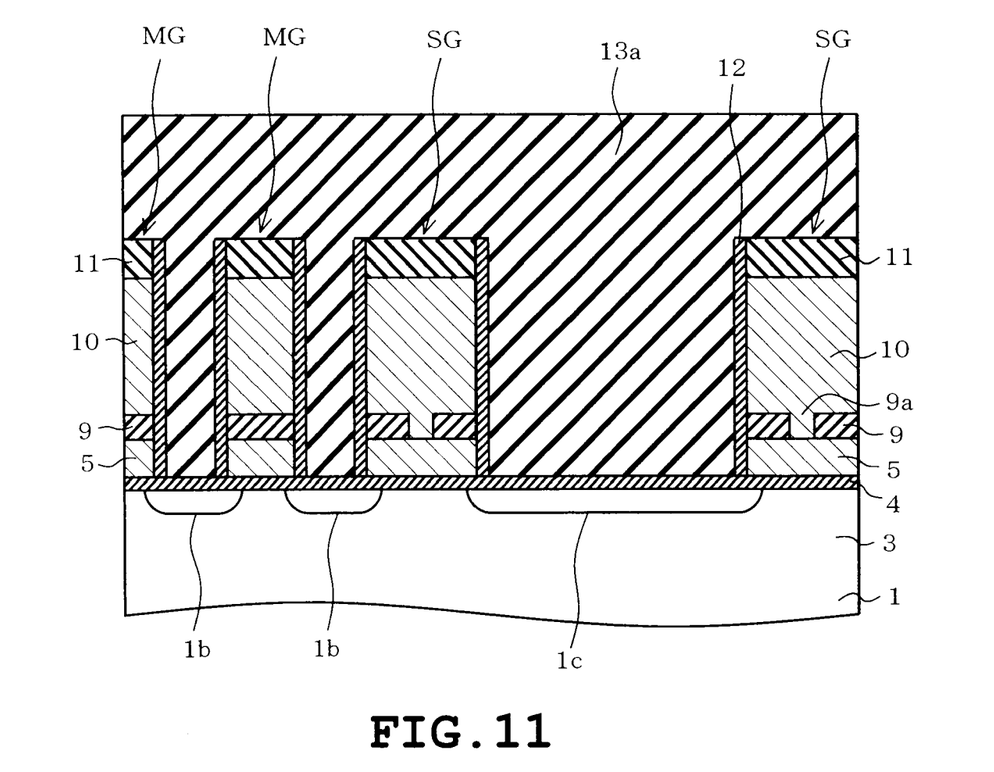

Subsequently, the PSZ film 13a is formed as the silicon oxide film 13 serving as an insulating film filling between the gate electrodes MG and MG and SG as shown in FIG. 11. In this step, the PSZ liquid is coated on the upper surface of the silicon substrate 1 formed with the gate electrodes MG and SG by the spin coating in the same manner as in the first embodiment. The predetermined baking treatment is carried out so that the coated PSZ liquid is formed into the PSZ film 13a. Thereafter, the first steam oxidation treatment is carried out at the first temperature ranging from 200° C. to 400° C., for example, at 280° C. or 300° C. The first steam oxidation treatment is a thermal treatment to stabilize film quality of the PSZ film 13a.

Figure 12:
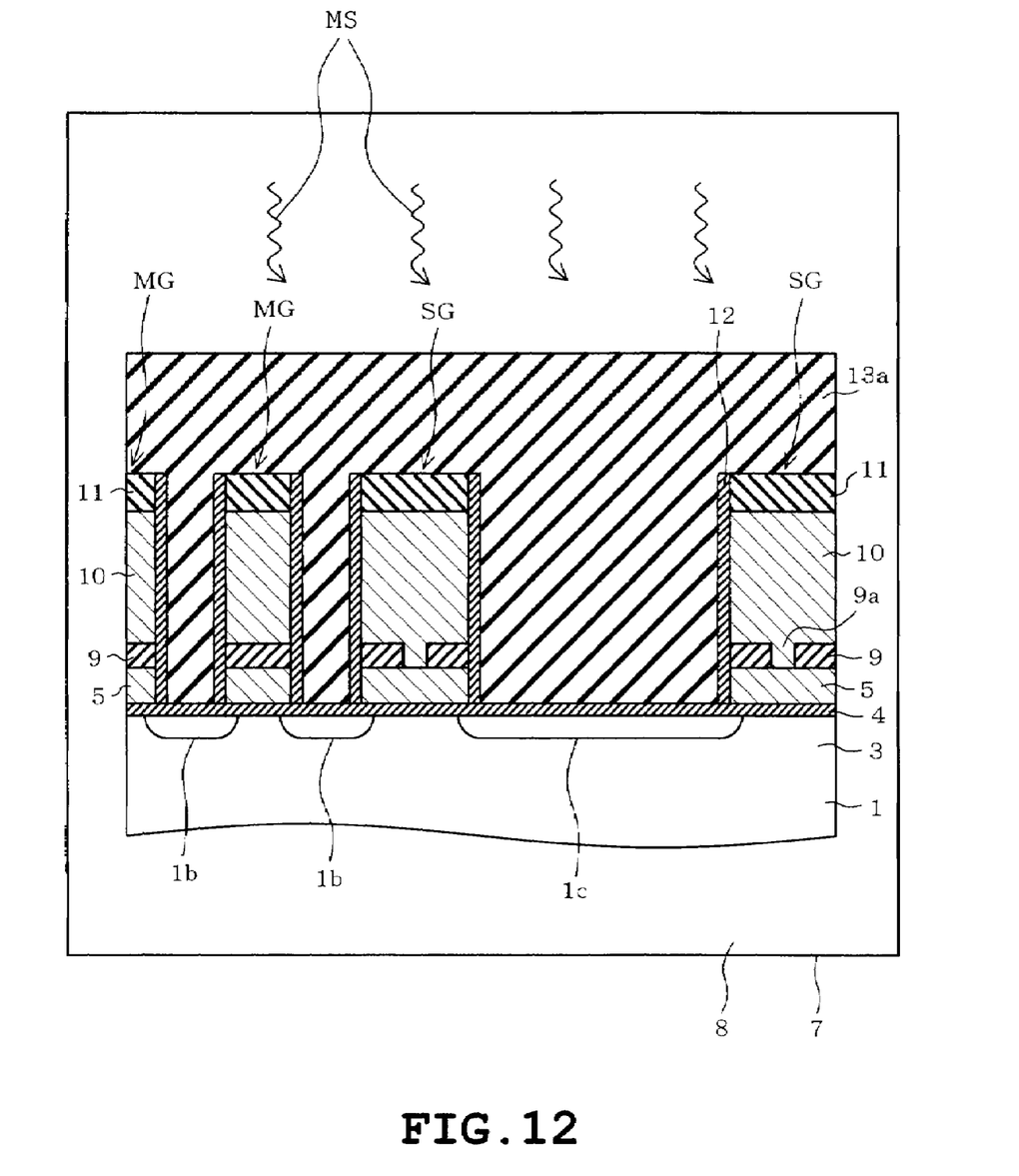

Subsequently, the megasonic application in the heated water is then carried out as shown in FIG. 12. This treatment employs the batch cleaning apparatus 7 so that the silicon substrate is soaked in heated water 8 whose temperature is at or above 50° C. or preferably at 60° C. An ultrasonic wave or more preferably, megasonic wave is applied to the heated water 8 in the cleaning apparatus 7 in the heated water treatment. Wave lines US in FIG. 12 designate application of the megasonic waves. The megasonic wave has a frequency ranging from several hundreds kHz to 2 MHz, 800 kHz (0.8 MHz), for example. Output of the megasonic wave to be applied is set to 100 W, for example, when the frequency ranges from several tens W to several hundreds W. Furthermore, a treatment time of the water treatment is set at several tens minutes or above, for example, about 30 minutes.

The above-described treatment by the heated water is carried out while the megasonic wave is applied to the heated water. As a result, the effect of the treatment by the heated water can be improved as compared with the case where oxidation acceleration is carried out only by the treatment by the heated water. It is considered that tensile stress caused in the film is reduced by film contraction occurring during conversion of the PSZ film 13a to the silicon oxide film 13. Consequently, occurrence of crack can be prevented.

Subsequently, the second steam oxidation treatment is carried out at the second temperature for the silicon substrate 1 which has been treated by the heated water. The second temperature ranges from 400° C. to 600° C. (high temperature range) and is at 550° C., for example. As the result of the second oxidation treatment, the PSZ film 13a is further hardened thereby to be stabilized, whereby the PSZ film 13a can be transformed to the silicon oxide film 13 in which occurrence of crack is suppressed and which has a desirable film quality. Subsequently, the CMP process is carried out in order that the silicon oxide film 13 located higher than the upper surfaces of the gate electrodes MG and SG may be removed while the silicon oxide film 13 remains between the gate electrodes MG, SG, and MG and SG. The silicon nitride film 11 serves as a stopper in the CMP process. The configuration as shown in FIG. 7 is obtained as the result of the CMP process. Additionally, another treatment by the heated water may subsequently be carried out with application of the megasonic wave to the heated water if needed, whereupon the film quality of the silicon oxide film 13 can further be stabilized.

According to the third embodiment, the PSZ film 13 can be formed between the gate electrodes MG, SG, and MG and SG as a silicon oxide film ($SiO_2$) with a fine film quality by a shortened fabrication process.

The invention should not be limited by the foregoing description of the embodiments. The embodiments can be modified or expanded as follows. Although the second steam oxidation treatment is carried out in the first and third embodiments, this treatment may be eliminated as the need arises. Even in this case, oxidation of the PSZ film 2b or 13a is enhanced since the treatment by the heated water is carried out with application of the megasonic wave to the heated water. In this case, too, oxidation of the PSZ film 2b or 13a is accelerated as the result of execution of the treatment by the heated water with application of megasonic wave. As a result, the above-described modified form can also stabilize the film quality with the process time being reduced as compared with the conventional fabrication process.

The thermal treatment conditions as used in the first embodiment are also used when the PSZ film 13a is formed into the silicon oxide film 13 in the third embodiment. However, the thermal treatment conditions used in the second embodiment may be used in the third embodiment.

The heated water used in the treatment by the heated water may have a temperature ranging from 50° C. to 100° C.

The time required for the treatment by the heated water may be set to be equal to or longer than several tens minutes (20 minutes, for example).

The megasonic wave can have a frequency ranging from several hundreds kHz to several MHz. Furthermore, the output of the megasonic wave may range from several tens kW to several hundreds W.

The first temperature in the first steam oxidation treatment may range from 200° C. to 400° C. (lower temperature range) The second temperature in the second steam oxidation treatment may be set at a suitable temperature (550° C. or above) in the range of 400° C. or above.

The foregoing description and drawings are merely illustrative of the principles of the present invention and are not to be construed in a limiting sense. Various changes and modifications will become apparent to those of ordinary skill in the art. All such changes and modifications are seen to fall within the scope of the invention as defined by the appended claims.

What is claimed is:

1. A method of fabricating a semiconductor device, comprising:
applying a coating oxide film to a surface of a substrate including a semiconductor substrate so that a recess formed in the surface is filled with the coating oxide film;
applying a steam oxidation treatment to the substrate at a first temperature;
soaking the substrate in heated water while applying a megasonic wave to the heated water; and
applying another steam oxidation treatment to the substrate at a second temperature higher than the first temperature.

2. The method according to claim 1, wherein the coating oxide film includes polysilazane.

3. The method according to claim 1, wherein the megasonic wave is applied to the heated water for several tens minutes or more.

4. The method according to claim 1, wherein the heated water has a temperature which is at or above 50° C.

5. The method according to claim 1, wherein the megasonic wave has a frequency ranging from several hundreds kHz to several MHz.

6. The method according to claim 1, wherein the megasonic wave has output ranging from several tens W to 2 kW.

7. The method according to claim 1, wherein the first temperature ranges from 200° C. to 400° C., and the second temperature is at or above 400° C.

8. The method according to claim 1, wherein the substrate is configured into a film configuration including an insulating film for processing, and in the recess forming step, a trench for element isolation is formed in the semiconductor substrate as the recess.

9. The method according to claim 1, wherein the substrate has a film structure for forming a gate electrode on the semiconductor substrate, and in the recess forming step, the film structure is etched so that a plurality of gate electrodes are separately formed.

* * * * *